(12) United States Patent
Allman et al.

(10) Patent No.: US 7,436,040 B2
(45) Date of Patent: Oct. 14, 2008

(54) METHOD AND APPARATUS FOR DIVERTING VOID DIFFUSION IN INTEGRATED CIRCUIT CONDUCTORS

(75) Inventors: Derryl D. J. Allman, Camas, WA (US); Hemanshu D. Bhatt, Vancouver, WA (US); Charles E. May, Fairview, OR (US); Peter Austin Burke, Portland, OR (US); Byung-Sung Kwak, Portland, OR (US); Sey-Shing Sun, Portland, OR (US); David T. Price, Gresham, OR (US); David Pritchard, Saxony (DE)

(73) Assignee: LSI Corporation, Milpitas, CA (US)

( * ) Notice: Subject to any disclaimer, the term of this patent is extended or adjusted under 35 U.S.C. 154(b) by 254 days.

(21) Appl. No.: 11/323,398

(22) Filed: Dec. 29, 2005

(65) Prior Publication Data

US 2007/0259518 A1   Nov. 8, 2007

(51) Int. Cl.
  *H01L 23/58* (2006.01)
(52) U.S. Cl. .................. 257/491; 257/334; 257/396; 257/503; 257/E21.17; 257/E21.532; 257/E21.585
(58) Field of Classification Search ................. 257/491, 257/334, 396, 492, 493, 499, 503, 520, 622, 257/762
See application file for complete search history.

(56) References Cited

U.S. PATENT DOCUMENTS

| | | | | |
|---|---|---|---|---|
| 4,826,455 | A | * | 5/1989 | Case et al. .................. 439/744 |
| 6,537,097 | B1 | * | 3/2003 | Szu ............................ 439/342 |
| 7,142,395 | B2 | * | 11/2006 | Swanson et al. ......... 360/245.9 |

OTHER PUBLICATIONS

T.C. Huang et al.; "Numerical Modeling and Characterization of the Stress Migration Behavior Upon Various 90 nanometer Cu/Low k Interconnects"; Jun. 2-4, 2003; 4 pages.
Derryl D. J. Allman et al.; "Method And Apparatus For Redirecting Void Diffusion Away From Vias In An Integrated Circuit Design"; Patent Application, 20 pages, Dec. 29, 2005.

* cited by examiner

*Primary Examiner*—David Nhu
(74) *Attorney, Agent, or Firm*—Eric James Whitesell

(57) ABSTRACT

A method of diverting void diffusion in an integrated circuit includes steps of forming an electrical conductor having a boundary in a first electrically conductive layer of an integrated circuit, forming a via inside the boundary of the electrical conductor in a dielectric layer between the first electrically conductive layer and a second electrically conductive layer of the integrated circuit, and forming a slot between the via and the boundary of the electrical conductor for diverting void diffusion in the electrical conductor away from the via.

13 Claims, 8 Drawing Sheets

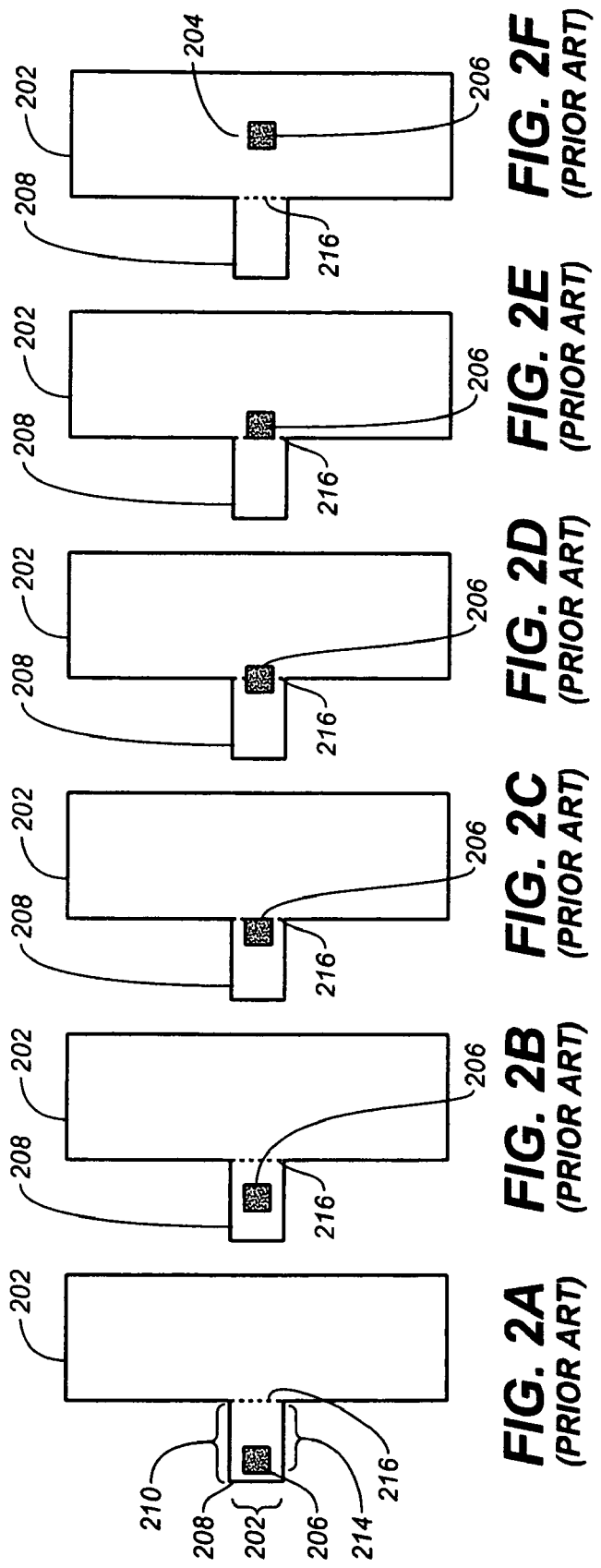

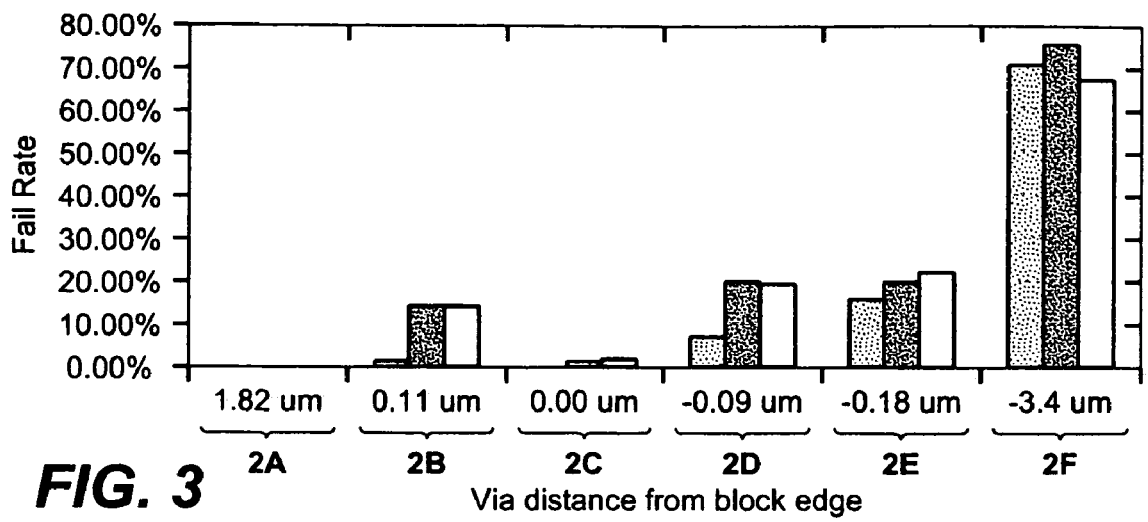
FIG. 3
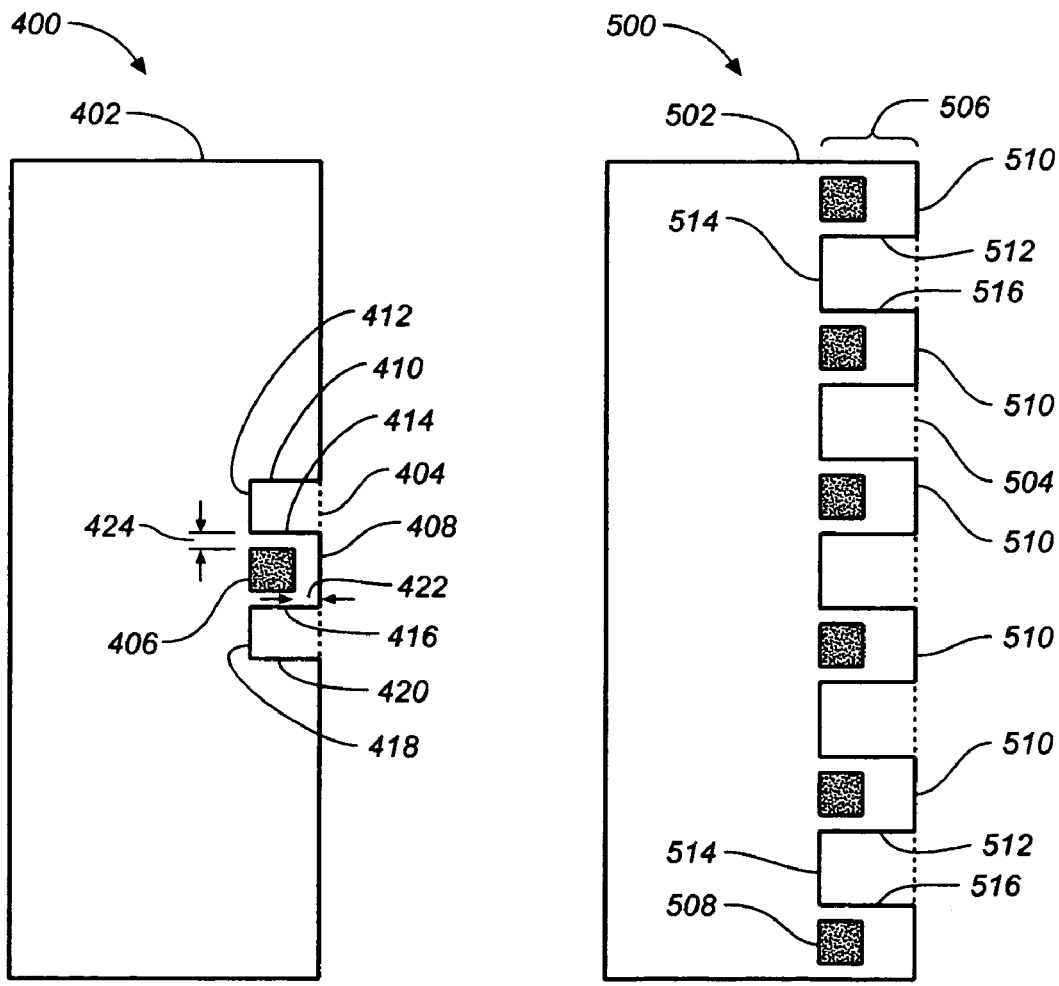
FIG. 4  FIG. 5

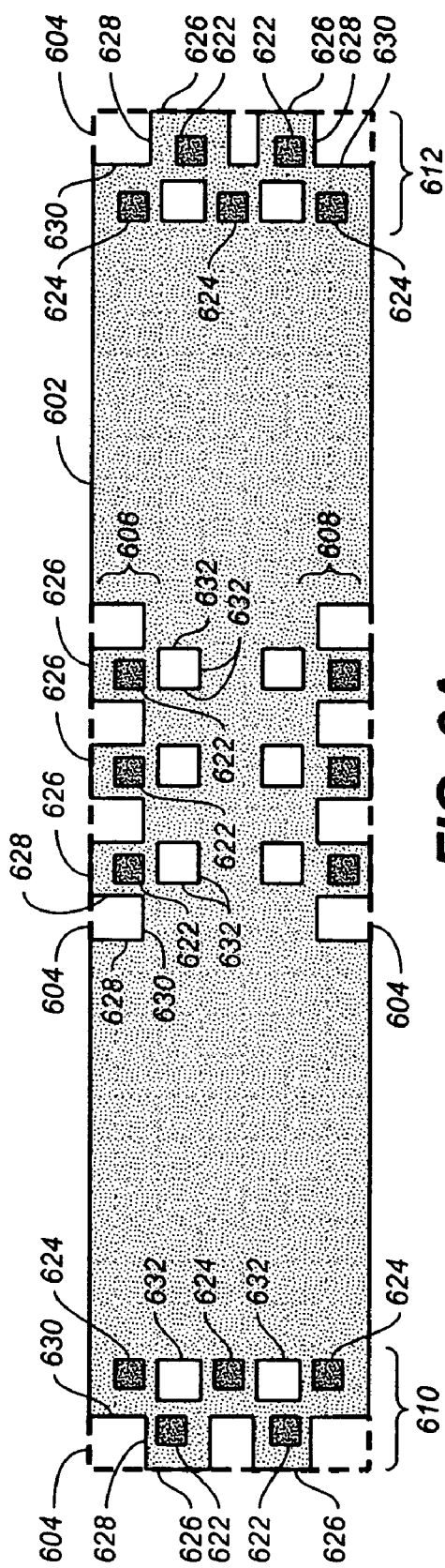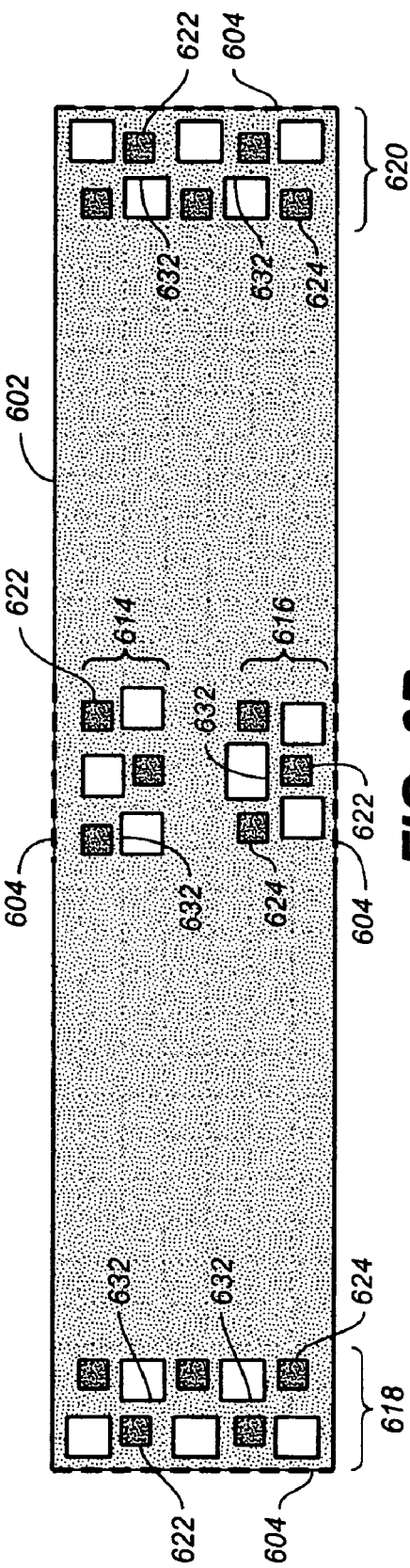
FIG. 6A
FIG. 6B

METHOD AND APPARATUS FOR DIVERTING VOID DIFFUSION IN INTEGRATED CIRCUIT CONDUCTORS

CROSS-REFERENCE TO RELATED APPLICATIONS

This application is related to U.S. patent application Ser. No. 11/323,400 filed on Dec. 29, 2005, titled "METHOD AND APPARATUS FOR REDIRECTING VOID DIFFUSION AWAY FROM VIAS IN AN INTEGRATED CIRCUIT DESIGN", by Allman et al., the entirety of which is incorporated herein by reference.

BACKGROUND OF THE INVENTION

1. Field of the Invention

The present invention is directed to the manufacture of integrated circuits. More specifically, but without limitation thereto, the present invention is directed to avoiding the diffusion of voids to vias in an integrated circuit.

2. Description of the Prior Art

Integrated circuit designs typically include electrical conductors such as metal lower metal levels formed in a top metal layer of the integrated circuit. Electrical connections between the electrical conductors in the top metal layer and lower level metal interconnect layers in the integrated circuit are generally made by forming vias between the electrical conductors in the top metal layer and electrical conductors in the lower level metal interconnect layers.

SUMMARY OF THE INVENTION

In one embodiment, an apparatus includes:
an electrical conductor having a boundary formed in a first electrically conductive layer of an integrated circuit;
a via formed inside the boundary of the electrical conductor in a dielectric layer between the first electrically conductive layer and a second electrically conductive layer of the integrated circuit; and
a slot formed inside the boundary of the electrical conductor between the via and the boundary of the electrical conductor for diverting void diffusion in the electrical conductor away from the via.

In another embodiment, a method includes steps of:
(a) forming an electrical conductor having a boundary in a first electrically conductive layer of an integrated circuit;
(b) forming a via inside the boundary of the electrical conductor in a dielectric layer between the first electrically conductive layer and a second electrically conductive layer of the integrated circuit; and
(c) forming a slot between the via and the boundary of the electrical conductor for diverting void diffusion in the electrical conductor away from the via.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein:

FIGS. 2A, 2B, 2C, 2D, 2E, and 2F illustrate top views of various placements of a via for making electrical connection with the lower metal level of FIG. 1;

FIG. 3 illustrates a bar graph of typical circuit failure for each of the via placements of FIG. 2;

FIG. 4 illustrates a top view of a lower metal level patterned to divert void diffusion away from a single via;

FIG. 5 illustrates a top view of a lower level metal layer patterned to divert void diffusion away from a via array;

FIGS. 6A and 6B illustrate top views of an interconnect patterned to divert void diffusion away from multiple via arrays;

Figure 1A:
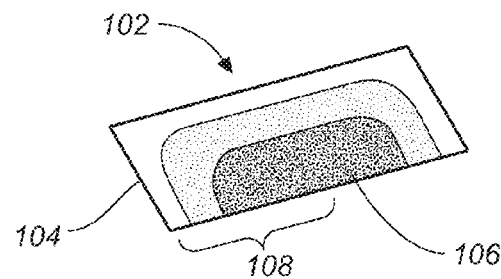
FIG. 1A illustrates a top view of the stress gradient in a typical lower metal level of the prior art.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

Integrated circuit designs typically include contact pads formed in a top metal layer of the integrated circuit. The contact pads in the top metal layer are connected to interconnect metal layers inside the integrated circuit by vias formed between the top metal layer and the interconnect layers. In a currently used architecture, trenches and vias are formed in a dielectric material that is filled with a sandwich of metal layers. The first metal layers are used to create a barrier layer between the interconnect metal and the dielectric material to avoid an interaction that may cause the dielectric to fail.

Following the first metal layers, a thin copper layer is deposited to form a seed layer for the electro-deposition of an additional copper metal interconnect layer. After filling the trenches with the metal interconnect layer, the metal is annealed and excess material is removed by a chemical mechanical polishing process, so that interconnect metal remains only in the trenches and vias.

A dielectric capping layer is then deposited to seal the metal interconnect layer that also serves as a barrier material. The previous sequence of steps is repeated to form additional metal interconnect layers in the integrated circuit. The metal barrier layer at the bottom of each via is in direct contact with the next metal layer, avoiding diffusion of copper between the interconnect metal layers.

In recent Cu/low k interconnect technology, diffusion of copper atoms along tensile stress gradients of large lower metal levels, for example, having a width greater than 0.75 microns and a length greater than 0.75 microns, results in stress induced voids inside the via and between the via and the contact pad. The voids break the electrical connection, resulting in circuit failure. Voids in metal interconnects and vias are believed to result from mass migration of metal toward a location of highest tensile stress, leaving voids in the areas of lowest tensile stress. The number of voids in a metal film is directly related to the density of the film or grain structure and distribution of grain sizes. The diffusion of voids, that is, the movement of metal to locations of high tensile stress, is driven by stress gradients in the metal film and by void concentration gradients. The resulting grain structure in a copper interconnect depends on the size of the interconnect. Larger copper interconnects have a larger grain structure in comparison to smaller copper interconnects. Also, the volume of the metal film has to be sufficient for forming a void that can cause a failure in an interconnect or a via.

Stress induced voiding has become a major reliability issue for Cu/low k interconnect technology. Due to the large variation in the properties of the materials used in circuit fabrication, for example, coefficient of thermal expansion and Young's modulus, a stress gradient is created across the integrated circuit that increases greatly in areas where large metal contact pads are present. Copper atoms diffuse through the vias and the contact pads along the stress gradient in a non-uniform manner, resulting in the formation of stress induced voids in the circuit.

One of the worst case geometrical features that frequently occurs in an integrated circuit design is when a small metal interconnect with a via at one end protrudes from a large block of metal, such as a clock tree or a power line. The voids in the large block diffuse to the end of the interconnect where the via is located, resulting in a failure of the via.

To counter the formation of stress induced voids, multiple vias may be added to provide extra sinks for void diffusion and reduce the probability of circuit failure. Disadvantageously, the geometrical criteria for adding vias are not easily implemented in software routing tools, and the loss of routing grids resulting from the added vias increases the difficulty of routing the integrated circuit design. Routing tools available for 90 nm designs and beyond generally do not include a function for adding a second via. Further, the addition of a second via increases the length of interconnects in the adjacent metal layers, typically by the width of the via plus the via spacing. The decrease in router efficiency results in increased circuit area and/or additional interconnect layers, increasing the turnaround time and cost of manufacturing the integrated circuit. Also, current integrated circuit design rules do not restrict the location of vias within the boundary of a large lower metal level, increasing the probability that stress induced voiding and resulting circuit failure will occur.

FIG. 1A illustrates a top view of the stress gradient in a typical lower metal level of the prior art. Shown in FIG. 1 are a lower metal level 102, an edge 104, a center 106, and a stress gradient 108.

In FIG. 1A, the stress gradient 108 illustrated by the light to dark shading increases from the edge 104 to the center 106 of the contact pad 102 as described in Huang, IITC 2003. Because the stress gradient is highest at the center 106, the degree of diffusion that results in voiding is highly dependent on via placement relative to the center 106.

Figure 1B:
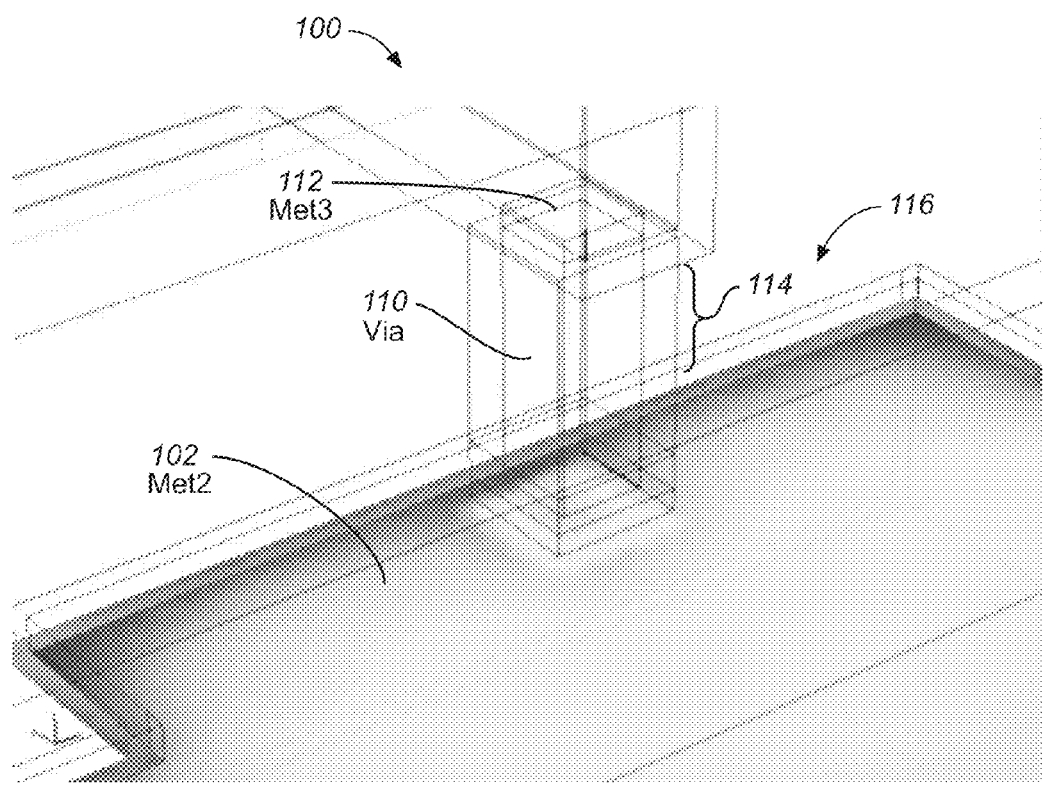
FIG. 1B illustrates a three-dimensional view of a lower metal level and a via of the prior art.

FIG. 1B illustrates a three-dimensional view 100 of a lower metal level and a via of the prior art. Shown in FIG. 1B are a lower metal level 102, a via 110, a top metal level line extension 112, a dielectric interface 114, and a dielectric layer 116.

In FIG. 1B, the highest compressive stress (low tensile stress) regions are nearest the edge of the lower metal level 102 and the dielectric interface 114, where the via 110 is in contact with the dielectric layer 116. Differences in the stress gradient below the via 110 are shown for the different sizes of the via 110.

FIGS. 2A, 2B, 2C, 2D, 2E, and 2F illustrate top views of various placements of a via for making electrical connection with the lower metal level of FIG. 1. Shown in FIGS. 2A, 2B, 2C, 2D, 2E, and 2F are a lower metal level 202, a center 204, a via 206, a lower metal level line extension 208, outside edges 210, 212, and 214, and a boundary 216.

In FIGS. 2A, 2B, 2C, 2D, 2E, and 2F, the via 206 is formed between the top metal layer in which the lower metal level 202 is formed and an inner metal layer typically used to make electrical connections within the integrated circuit. For purposes of illustration, the via 206 is shown superimposed on the top metal layer.

Because the reduction in stress induced voiding resulting from placing the via 206 at the boundary 216 of the lower metal level 202 where the lowest diffusion occurs may still not be sufficient to meet stringent reliability standards, the line extension 208 is added to the lower metal level 202 to further relieve induced stress at the via 206. The line extension 208 extends outside the boundary 216 of the lower metal level 202.

In FIG. 2A, the via 206 is placed inside the line extension 208 near the outside edge 212 of the line extension 208.

In FIG. 2B, the via 206 is placed in the center of the line extension 208.

In FIG. 2C, the via 206 is placed inside the via 208 just outside the boundary 216 of the lower metal level 202.

In FIG. 2D, the via 206 is placed in the line extension 208 so that the via 206 straddles the boundary 216 of the lower metal level 202.

In FIG. 2E, the via 206 is placed just inside the boundary 216 of the lower metal level 202 at the end of the line extension 208.

In FIG. 2F, the via 206 is placed at the center 204 of the lower metal level 202.

FIG. 3 illustrates a bar graph 300 of the relative circuit failure rate for each of the via placements of FIG. 2. The three bars shown for each of the examples 2A, 2B, 2C, 2D, 2E, and 2F represent three different sample lots. As may be appreciated from FIG. 3, the arrangements of FIGS. 2A and 2C result in the lowest failure rate, while the center placement of FIG. 2F results in the highest failure rate.

An alternative to placing the via 206 in the line extension 208 that also provides the benefit of low failure rate is described as follows.

In one embodiment, a device for diverting void diffusion in an integrated circuit includes:

an electrical conductor having a boundary formed in a first electrically conductive layer of an integrated circuit;

a via formed inside the boundary of the electrical conductor between the first electrically conductive layer and a second electrically conductive layer of the integrated circuit; and a slot formed inside the boundary of the electrical conductor between the via and the boundary of the electrical conductor.

FIG. 4 illustrates a top view 400 of a lower metal level patterned to divert void diffusion away from a single via. Shown in FIG. 4 are a lower metal level 402, a boundary 404, a via 406, an outside edge 408, slots 410 and 420, an end overlap 422, and a side overlap 424.

In FIG. 4, the via 406 is placed inside the boundary 404 of the lower metal level 402, for example, about 0.055 microns from the outside edge 408 of the lower metal level 402. The slots 410 and 420 are formed in the lower metal level 402 to form the side overlap 424 in the lower metal level 402. The end overlap 422 extends from the outside edge of the via 406 to the outside edge 408 of the lower metal level 402. In one embodiment, the end overlap is 0.055 microns, and the side overlap is 0.001 microns. The slots 410 and 420 provide the same reduction in stress induced voiding afforded by the line extension 208 in FIGS. 2A and 2C while placing the via 406 inside the boundary 404 of the lower metal level 402, advantageously avoiding the routing difficulty explained above.

FIG. 5 illustrates a top view 500 of a lower level metal layer patterned to divert void diffusion from a via array. Shown in FIG. 5 are a lower level metal layer 502, a boundary 504, a via array 506, vias 508, outside edges 510, and slots 512.

In FIG. 5, each of the vias 508 in the via array 506 is placed inside the boundary 504 of the lower level metal layer 502, for example, about 0.055 microns from the outside edges 510 of the lower level metal layer 502. The slots 512 are formed inside the boundary 504 of the lower level metal layer 502 between each of the vias 508 by removing a portion of the lower level metal layer 502.

FIGS. 6A and 6B illustrate top views of an interconnect patterned to divert void diffusion away from multiple via arrays. Shown in FIGS. 6A and 6B are an interconnect 602, a boundary 604, via arrays 606, 608, 610, 612, 614, 616, 618 and 620, vias 622 and 624, and slots 626, 628, 630 and 632.

In FIGS. 6A and 6B, the interconnect 602 may be, for example, an electrical conductor in the top metal layer of an integrated circuit having multiple connection points to lower interconnect metal layers.

In FIG. 6A, each of the vias 622 in the via arrays 606 and 608 is placed inside the boundary 604 of the interconnect 602, leaving an end overlap of, for example, about 0.055 microns between the vias 622 and the boundary 604 of the interconnect 602. The slots are formed inside the boundary 604 of the interconnect 602 between each of the vias 622 by removing a portion of the interconnect 602. The slots 628 are formed behind each of the vias 622 in the via arrays 606 and 608 as shown.

In the via arrays 610 and 612, an additional row or column of vias 624 is added inside the first row of vias 622 in a staggered arrangement between the slots 628 behind each of the vias 622. In an alternative embodiment, rectangular shaped vias may be used to increase via area as a substitute for a via array.

In FIG. 6B, each of the vias 622 in the via arrays 614, 616, 618 and 620 is placed inside the boundary 604 of the interconnect 602, leaving an end overlap of, for example, about 0.055 microns between the vias 622 and the boundary 604 of the interconnect 602. The slots 630 are formed inside the boundary 604 of the interconnect 602 between each of the vias 622 by removing a portion of the interconnect 602, leaving a portion of the interconnect 602 between the slots 630 and the boundary 604 of the interconnect 602. The slots 628 are formed behind each of the vias 622 in the via arrays 614, 616, 618 and 620 as shown.

In the via arrays 614, 616, 618 and 620, an additional row or column of vias 624 is added inside the first row of vias 622 in a staggered arrangement between the slots 632 behind each of the vias 622.

Figure 7:
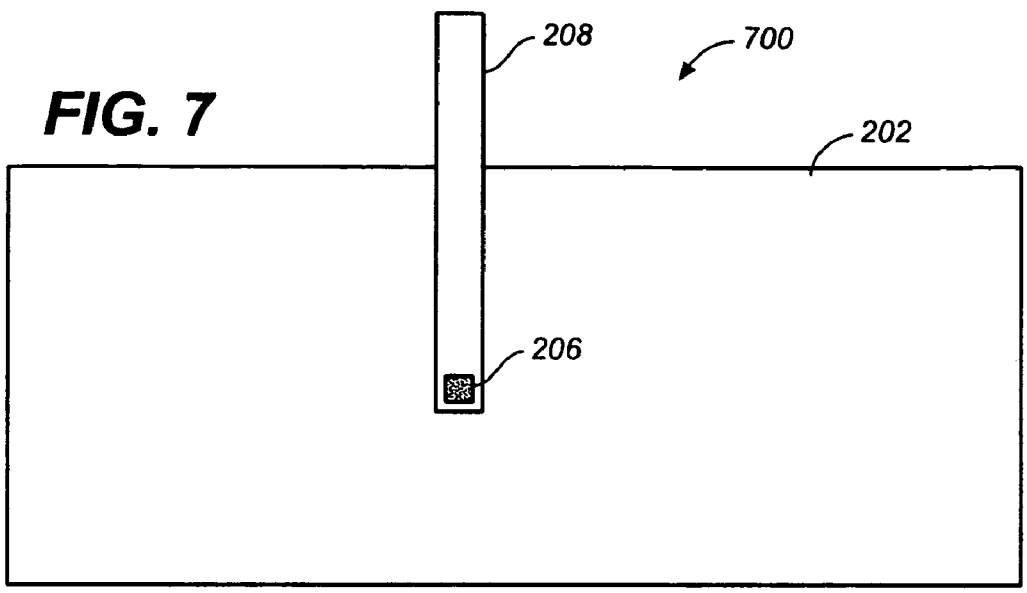
FIG. 7 illustrates a top view of the lower metal level and the via of FIG. 2F before forming slots in the lower level metal layer.

FIG. 7 illustrates a top view 700 of the lower metal level and the via of FIG. 2F before forming slots in the lower level metal layer. Shown in FIG. 7 are a lower level metal layer 202, a via 206, and an upper level metal line extension 208.

In FIG. 7, the via 206 is subject to a high failure rate as described above with reference to the failure rate for the via 2F plotted in FIG. 3.

Figure 8:
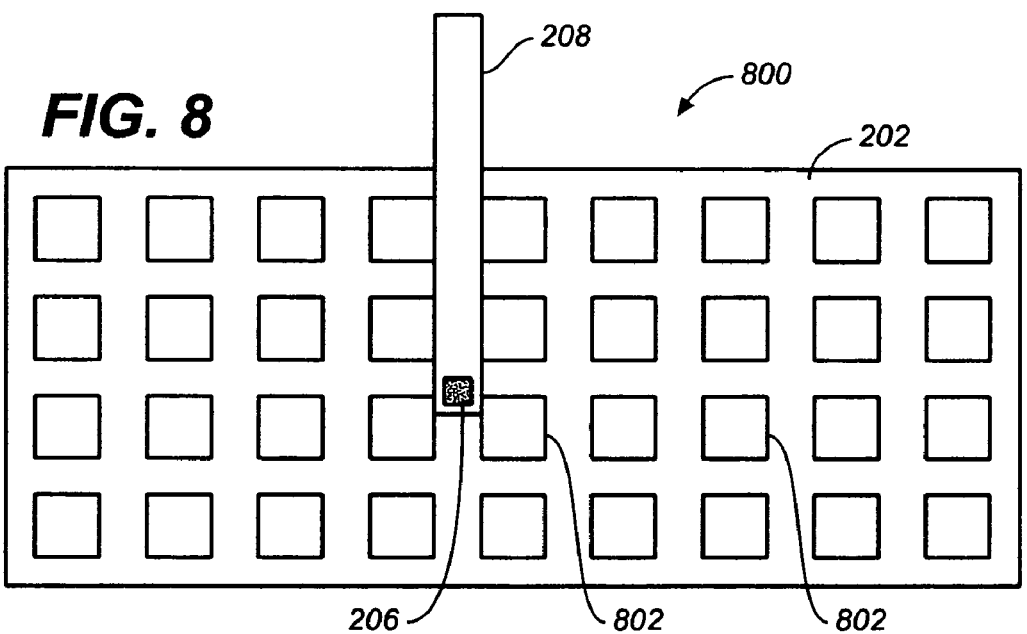
FIG. 8 illustrates a top view of the lower level metal layer and the via of FIG. 7 after forming slots in the lower level metal layer around the via.

FIG. 8 illustrates a top view 800 of the lower metal level and via of FIG. 7 after forming slots in the lower level metal layer around the via. Shown in FIG. 8 are a lower level metal layer 202, a via 206, an upper level line extension 208, and slots 802.

In FIG. 8, the slots 802 are formed in the lower level metal layer 202 around the via 206. The slots 802 in the lower level metal layer 202 relieve tensile stress in the lower metal level 202 around the vias 206, resulting in increased via lifetime.

Figure 9A:
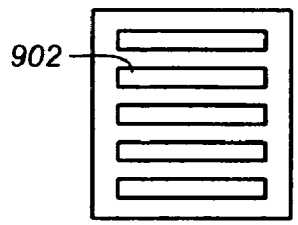
FIGS. 9A and 9B illustrate examples of multiple rectangular patterns that may be used in place of the single rectangular pattern in FIGS. 4, 5, 6A, 6B and 8.
Figure 9B:
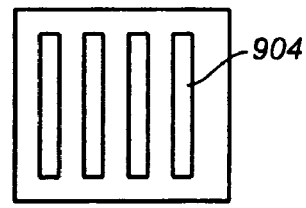

FIGS. 9A and 9B illustrate examples of slot patterns that may be used in place of the single rectangular shape of the slots in FIGS. 4, 5, 6A, 6B and 8. FIG. 9A illustrates a pattern of horizontal rectangles 902, and FIG. 9B illustrates a pattern of vertical rectangles 904. In further embodiments, other slot patterns may be used within the scope of the appended claims.

Further stress relief may be achieved to divert stress induced voids away from vias by forming stress relief voids in the dielectric layer adjacent to the vias as described below.

FIGS. 10A-10F illustrate a series of steps for forming a stress relief void in a dielectric layer. Shown in FIGS. 10A-10F are a photo resist layer 1002, stress relief voids 1004, a dielectric layer 1006, a lower metal layer 1008, a trench 1010, a via 1012, a top level metal layer 1014, an electrical conductor 1016, and a top barrier film 1018.

Figure 10A:
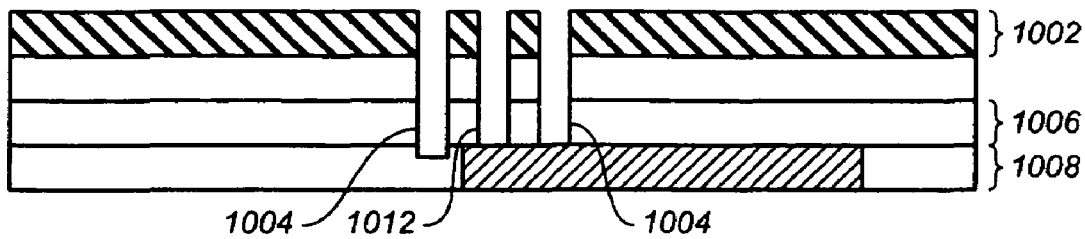
FIGS. 10A-10F illustrate a series of steps for forming a stress relief void in a dielectric layer.

In FIG. 10A, the stress relief voids 1004 and the via 1012 are formed in the same manner during the via etch, for example, in a dual damascene process with via first, through the photo resist layer 1002 and the dielectric layer 1006. The stress relief voids 1004 in the dielectric layer 1006 may be, for example, the same size as the via 1012. In an alternative embodiment, the stress relief voids 1004 may be about 15 percent smaller than the via 1012.

Figure 10B:
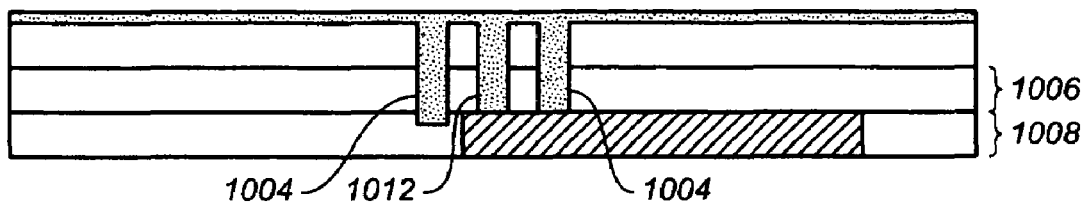

In FIG. 10B, the photo resist layer 1002 is removed, and the stress relief voids 1004 and the via 1012 are filled, for example, with a temporary Novolac resin.

Figure 10C:
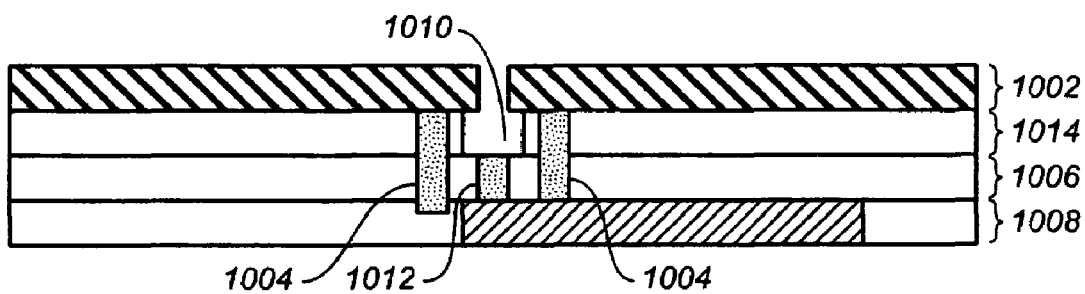

In FIG. 10C, the photo resist layer 1002 is re-applied to the surface of the wafer and removed to expose the top metal layer 1014 where metal is to be placed. The dielectric layer 1006 is etched again to form the trench 1010 for placing metal in the top metal layer 1014 so that the resin remains in the via 1012.

Figure 10D:
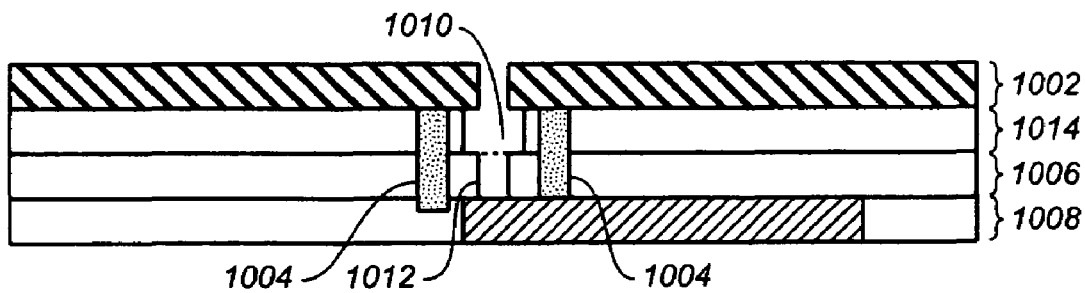

In FIG. 10D, the photo resist layer 1002 and the resin remaining in the via 1012 are removed at approximately the same rates, for example, by a solvent or a plasma clean using a nitrogen and hydrogen gas (HN3).

Figure 10E:
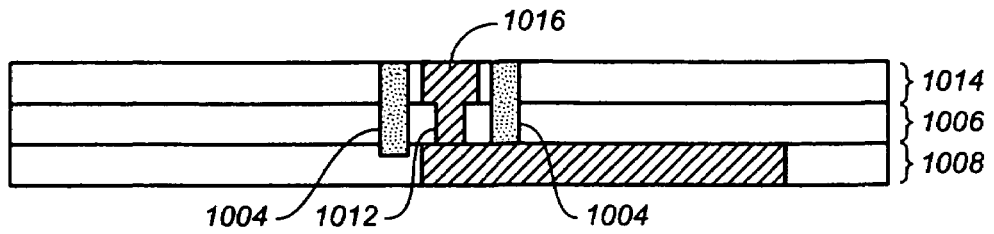

In FIG. 10E, copper plating, annealing, and polishing is performed according to well-known techniques to form the electrical conductor 1016 and the via 1012. The electrical conductor 1016 may be, for example, a metal trace or line.

Figure 10F:
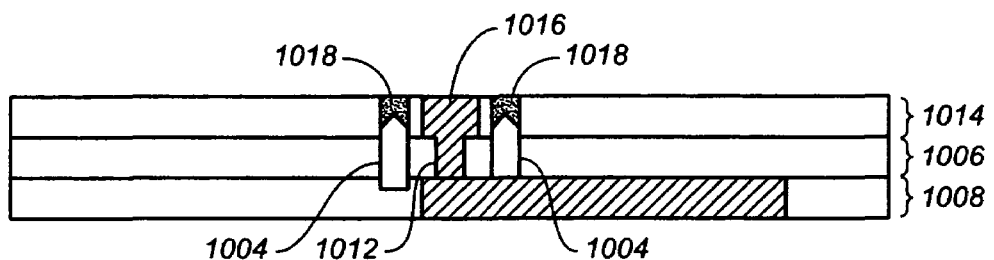

In FIG. 10F, the resin in the stress relief voids 1004 is removed, for example, by a solvent or a plasma clean using a nitrogen and hydrogen gas (HN3) to form voids in the dielectric layer 1006. The top barrier film 1018 is formed, for example, by depositing a passivating film such as silicon carbide or silicon nitride on the surface of the wafer. Preferably, the thickness of the top barrier film 1018 is greater than half the diameter of the stress relief voids 1004. When the top barrier film 1018 is formed by a chemical vapor deposition process (CVD), the aspect ratio is greater than two, so the film will not fill the stress relief voids 1004 before the opening at the top of the stress relief voids 1004 is closed off by the film deposition.

Figure 11:
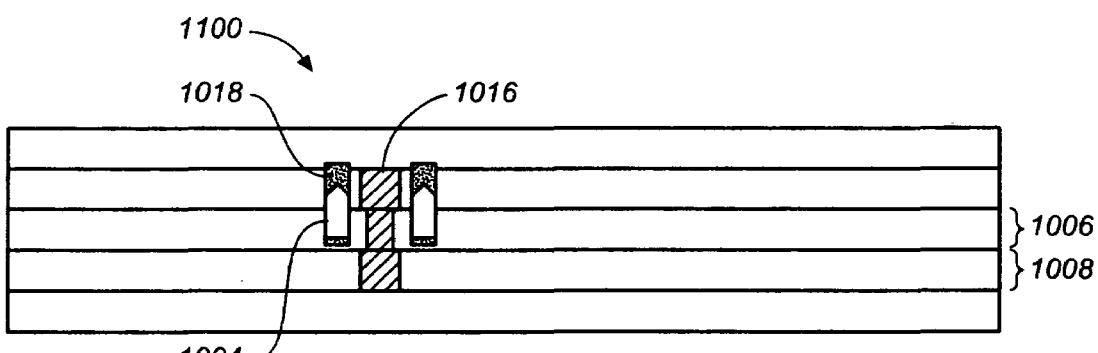
FIG. 11 illustrates a side view of a via and a stress relief void formed in the dielectric layer on each side of the via.

FIG. 11 illustrates a side view 1100 of a via and a stress relief void formed in the dielectric layer on each side of the via. Shown in FIG. 6 are stress relief voids 1004, a dielectric layer 1006, a lower level metal layer 1008, a via 1012, an electrical conductor 1016, and a top barrier film 1018.

In FIG. 11, the stress relief voids 1004 in the dielectric layer 1006 relieve local tensile stress around the via 1012, which diverts the formation of voids in the electrically conductive metal away from the via 1012. As a result, the rate of void formation and failure rate is reduced in the via 1012.

Figure 12:
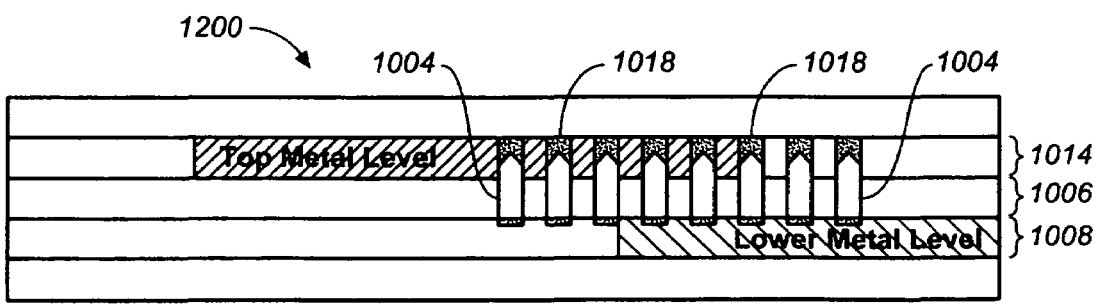
FIG. 12 illustrates a side view of a via and multiple stress relief voids formed in the dielectric layer on each side of the via.

FIG. 12 illustrates a side view 1200 of a via and multiple voids formed in the dielectric layer on each side of the via. Shown in FIG. 12 are stress relief voids 1004, a dielectric layer 1006, a lower level metal layer 1008, a via 1012, a top level metal layer 1014, and a top barrier film 1018.

In FIG. 12, the multiple stress relief voids 1004 are formed both in the top level metal layer 1014 and in the dielectric layer 1006 on each side of the via 1012 to further relieve local tensile stress in the via 1012. As a result, the formation of voids in the electrically conductive metal is diverted away from the via 1012, reducing the rate of void formation and failure rate.

In another embodiment, a method of diverting void diffusion in integrated circuit conductors includes steps of:
(a) forming an electrical conductor having a boundary in a first electrically conductive layer of an integrated circuit;
(b) forming a via inside the boundary of the electrical conductor between the first electrically conductive layer and a second electrically conductive layer of the integrated circuit; and
(c) forming a slot in the electrical conductor adjacent to the via between the via and the boundary of the electrical conductor.

Figure 13:
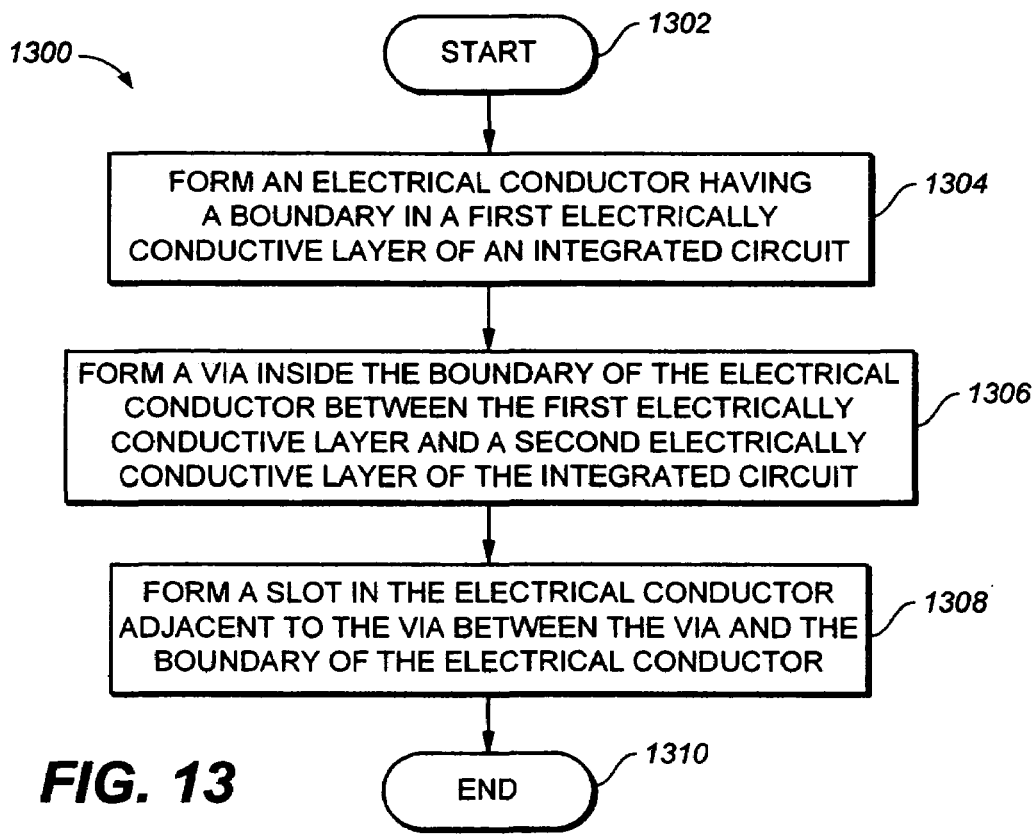
FIG. 13 illustrates a flow chart for a method of diverting void diffusion in an integrated circuit.

FIG. 13 illustrates a flow chart for a method of patterning a lower metal level in an integrated circuit to avoid stress induced voiding.

Step 1302 is the entry point for the flow chart 1300.

In step 1304, an electrical conductor is formed having a boundary in a first electrically conductive layer of an integrated circuit. The boundary defines the interface between the electrical conductor and a dielectric portion of the first electrically conductive layer that separates the electrical conductor from other electrical conductors in the first electrically conductive layer before forming slots in the electrical conductor to relieve tensile stress.

In step 1306, a via is formed inside the boundary of the electrical conductor between the first electrically conductive layer and a second electrically conductive layer of the integrated circuit.

In step 1308, a slot is formed in the electrical conductor adjacent to the via between the via and the boundary of the electrical conductor.

Step 1310 is the exit point for the flow chart 1300.

In a further embodiment, a method of diverting void diffusion in integrated circuit conductors includes steps of:
(a) forming an electrical conductor having a boundary in a first electrically conductive layer of an integrated circuit;
(b) forming a via inside the boundary of the electrical conductor in a dielectric layer between the first electrically conductive layer and a second electrically conductive layer of the integrated circuit; and
(c) forming a stress relief void in the dielectric layer adjacent to the via for diverting void diffusion in the electrical conductor away from the via.

Figure 14:
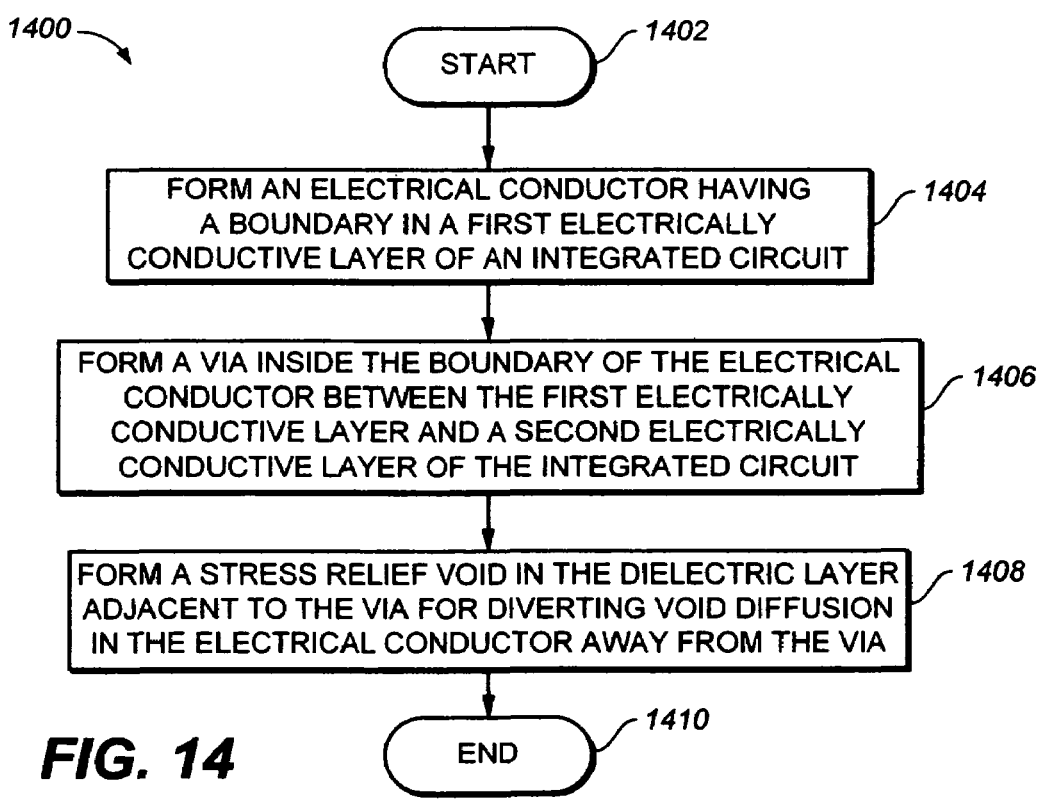
FIG. 14 illustrates a flow chart for a method of patterning a lower metal level in an integrated circuit to avoid stress induced voiding with stress relief voids.

FIG. 14 illustrates a flow chart 1400 for a method of patterning a lower metal level in an integrated circuit to avoid stress induced voiding with stress relief voids.

Step 1402 is the entry point for the flow chart 1400.

In step 1404, an electrical conductor having a boundary is formed in a first electrically conductive layer of an integrated circuit.

In step 1406, a via is formed inside the boundary of the electrical conductor in a dielectric layer between the first electrically conductive layer and a second electrically conductive layer of the integrated circuit.

In step 1408, a stress relief void is formed in the dielectric layer adjacent to the via for diverting void diffusion in the electrical conductor away from the via. By way of example, the stress relief void may be formed as described above with reference to FIGS. 10A-10F. In other embodiments, the stress relief void may formed in both the dielectric layer and the top metal layer as shown in FIG. 12.

Step 1410 is the exit point for the flow chart 1400.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. An apparatus comprising:
an electrical conductor having a boundary formed in a first electrically conductive layer of an integrated circuit;
a via formed inside the boundary of the electrical conductor in a dielectric layer between the first electrically conductive layer and a second electrically conductive layer of the integrated circuit; and
a slot formed inside the boundary of the electrical conductor between the via and the boundary of the electrical conductor for diverting void diffusion in the electrical conductor away from the via.

2. The apparatus of claim 1 further comprising the slot having a shape of a single rectangle.

3. The apparatus of claim 1 further comprising the slot having a shape of an array of rectangles.

4. The apparatus of claim 1 further comprising the slot having a width substantially equal to a width of the via.

5. The apparatus of claim 1 further comprising the slot having a width that is no greater than a width of the via.

6. The apparatus of claim 1 further comprising:
an additional via formed inside the boundary of the electrical conductor between the first electrically conductive layer and a second electrically conductive layer of the integrated circuit; and
an additional slot formed inside the boundary of the electrical conductor between the via and the boundary of the electrical conductor.

7. The apparatus of claim 6, the additional via further comprising a row or a column of a via array.

8. The apparatus of claim 1 further comprising a side overlap and an end overlap formed between the via and the slot.

9. The apparatus of claim 8 further comprising the side overlap extending about 0.001 microns from the slot to the via and the end overlap extending about 0.055 microns from the slot to the via.

10. The apparatus of claim 1 further comprising a slot array formed adjacent to the boundary of the electrical conductor in an electrically conductive layer of the integrated circuit to relieve a stress gradient in the electrical conductor.

11. The apparatus of claim 1 further comprising the via formed in an elongated rectangular shape.

12. An apparatus comprising:
an electrical conductor having a boundary formed in a first electrically conductive layer of an integrated circuit;
a via formed in a dielectric layer between the first electrically conductive layer and a second electrically conductive layer of the integrated circuit; and
a stress relief void formed in the dielectric layer adjacent to the via for diverting void diffusion in the electrical conductor away from the via.

13. The apparatus of claim 12 further comprising the stress relief void formed in both the dielectric layer and the first electrically conductive layer.

* * * * *